United States Patent
Tsuji

(10) Patent No.: US 9,934,874 B2
(45) Date of Patent: Apr. 3, 2018

(54) STORAGE MEDIUM MANAGEMENT DEVICE, STORAGE MEDIUM MANAGEMENT METHOD, STORAGE MEDIUM, AND STORAGE MEDIUM MANAGEMENT SYSTEM

(71) Applicant: Kabushiki Kaisha Toshiba, Minato-ku, Tokyo (JP)

(72) Inventor: Kiyotaka Tsuji, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/837,569

(22) Filed: Aug. 27, 2015

(65) Prior Publication Data

US 2016/0172061 A1 Jun. 16, 2016

(30) Foreign Application Priority Data

Dec. 10, 2014 (JP) ................. 2014-250351

(51) Int. Cl.
| | |
|---|---|
| *G11C 29/00* | (2006.01) |
| *G11C 16/26* | (2006.01) |
| *G11C 16/10* | (2006.01) |
| *G11C 29/44* | (2006.01) |
| *G11C 29/04* | (2006.01) |

(52) U.S. Cl.
CPC .......... *G11C 29/765* (2013.01); *G11C 29/44* (2013.01); *G11C 2029/0409* (2013.01); *G11C 2029/4402* (2013.01)

(58) Field of Classification Search
CPC ......... G11C 29/70; G11C 16/10; G11C 16/26; G11C 29/44; G11C 29/765; G11C 2029/4402
See application file for complete search history.

(56) References Cited

U.S. PATENT DOCUMENTS

| | | | | |
|---|---|---|---|---|
| 2009/0313444 A1* | 12/2009 | Nakamura | ............ | G06F 11/008 |
| | | | | 711/159 |
| 2013/0227246 A1* | 8/2013 | Hirao | ................. | G06F 12/0246 |
| | | | | 711/206 |
| 2014/0289453 A1* | 9/2014 | Takeda | ................ | G06F 12/0246 |
| | | | | 711/103 |

FOREIGN PATENT DOCUMENTS

JP 2014-186614 A 10/2014

* cited by examiner

*Primary Examiner* — Kyle Vallecillo
(74) *Attorney, Agent, or Firm* — Knobbe, Martens, Olson & Bear, LLP

(57) ABSTRACT

A storage medium management device may include a non-volatile storage, an error information register, and a congenital defective block identification register. The storage stores a defective block identification indicating a location of a defective block in a plurality of storage media. The error information register stores error information indicating that an error has occurred in access to the plurality of storage media. If at least one of the plurality of storage media has been replaced, the congenital defective block identification register identifies based on the error information a replaced storage medium of the plurality of storage media, reads a congenital defective block identification indicating a location of a congenital defective block from a prescribed block of the storage medium replaced, and updates the defective block identification of the replaced storage medium, with the congenital defective block identification read out from the replacing storage medium.

8 Claims, 7 Drawing Sheets

FIG. 3

| BLOCK ADDRESS | ERROR INFORMATION | |
|---|---|---|
| 0000 | 0 | ～111 |
| ... | 1 | |
| ... | 1 | |
| ... | ... | |
| 0FFF | ... | |
| 1000 | 1 | |
| ... | 0 | |
| ... | 0 | |
| ... | ... | |
| 1FFF | ... | |
| 2000 | 0 | |
| ... | 0 | |
| ... | 0 | |
| ... | ... | |
| 2FFF | ... | |
| 3000 | 0 | |
| ... | 1 | |
| ... | 0 | |
| ... | ... | |
| 3FFF | ... | |

FIG. 4

| BLOCK ADDRESS | ERROR INFORMATION | |
|---|---|---|
| 0000 | 0 | ⎫ |
| ... | 1 | ⎬ STORAGE MEDIA 6-1 |
| ... | 1 | |
| ... | ... | |
| 0FFF | ... | ⎭ |
| 1000 | 1 | ⎫ |
| ... | 0 | |
| ... | 0 | ⎬ STORAGE MEDIA 6-2 |
| ... | ... | |
| 1FFF | ... | ⎭ |
| 2000 | 0 | ⎫ |
| ... | 0 | |
| ... | 0 | ⎬ STORAGE MEDIA 6-3 |
| ... | ... | |
| 2FFF | ... | ⎭ |
| ⋮ | ⋮ | ⋮ |
| (n-1)000 | ... | ⎫ |
| ... | ... | |
| ... | ... | ⎬ STORAGE MEDIA 6-n |
| ... | ... | |
| (n-1)FFF | ... | ⎭ |

| STORAGE MEDIUM IDENTIFICATION | DEFECTIVE BLOCK ADDRESS INFORMATION | ERROR OCCURRENCE COUNT |
|---|---|---|
| 1 | 0000<br>0142<br>0F10 | 15 |
| 2 | ... | 20 |
| 3 | ... | 5 |
| 4 | ... | ... |
| ... | ... | ... |
| n | ... | ... |

~121

STORAGE MEDIUM MANAGEMENT DEVICE, STORAGE MEDIUM MANAGEMENT METHOD, STORAGE MEDIUM, AND STORAGE MEDIUM MANAGEMENT SYSTEM

CROSS-REFERENCE TO RELATED APPLICATION

This application is based upon and claims the benefit of priority from Japanese Patent Application No. 2014-250351, filed Dec. 10, 2014; the entire contents of which are incorporated herein by reference.

FIELD

Embodiments described herein relate generally to a storage medium management device, a storage medium management method, a storage medium, and a storage medium management system.

BACKGROUND

Memory units configured by a plurality of NAND flash memories (hereinafter, "NAND memories") have come into practical use. In general, the storage area of a NAND memory includes to some extent a number of congenitally defective blocks (hereinafter, "congenital defective blocks"). For this reason, when using the NAND memory, it is necessary for the user to use normal blocks that excluded the congenital defective blocks, based on congenital defective block identification indicating which blocks are congenital defective blocks. NAND memories are shipped with congenital defective block identification stored in a prescribed block. Because the congenital defective block identification is stored in a block that is usable by the user, once use of the NAND memory begins, there is a possibility that it might be overwritten by the user. For this reason, the user reads the congenital defective block identification out from the NAND memory and stores it into a separate storage device when beginning to use the NAND memory.

In a memory unit configured by such NAND memories, when the power is switched on, the congenital defective block identification is read out from all of the NAND memories and stored into a defective block management table that manages the defective blocks. The memory unit holds data by using normal blocks other than defective blocks, including the congenital defective blocks registered in the defective block management table.

In such a memory unit, however, if an error occurs in part of the NAND memories, it is necessary for a maintenance person to replace the failed NAND memory and then manually perform maintenance to the defective block management table. For this reason, the memory unit maintenance task might incur a high cost.

BRIEF DESCRIPTION OF THE DRAWINGS

FIG. 3 is a drawing showing a specific example of defective block identification.

FIG. 4 is a drawing showing the associations between block addresses and each storage media 6.

FIG. 5 is a drawing showing a specific example of error information.

DETAILED DESCRIPTION

The storage medium management device, the storage medium management method, the storage medium, and the storage medium management system of an embodiment will be described below, with references made to the drawings.

Figure 1:
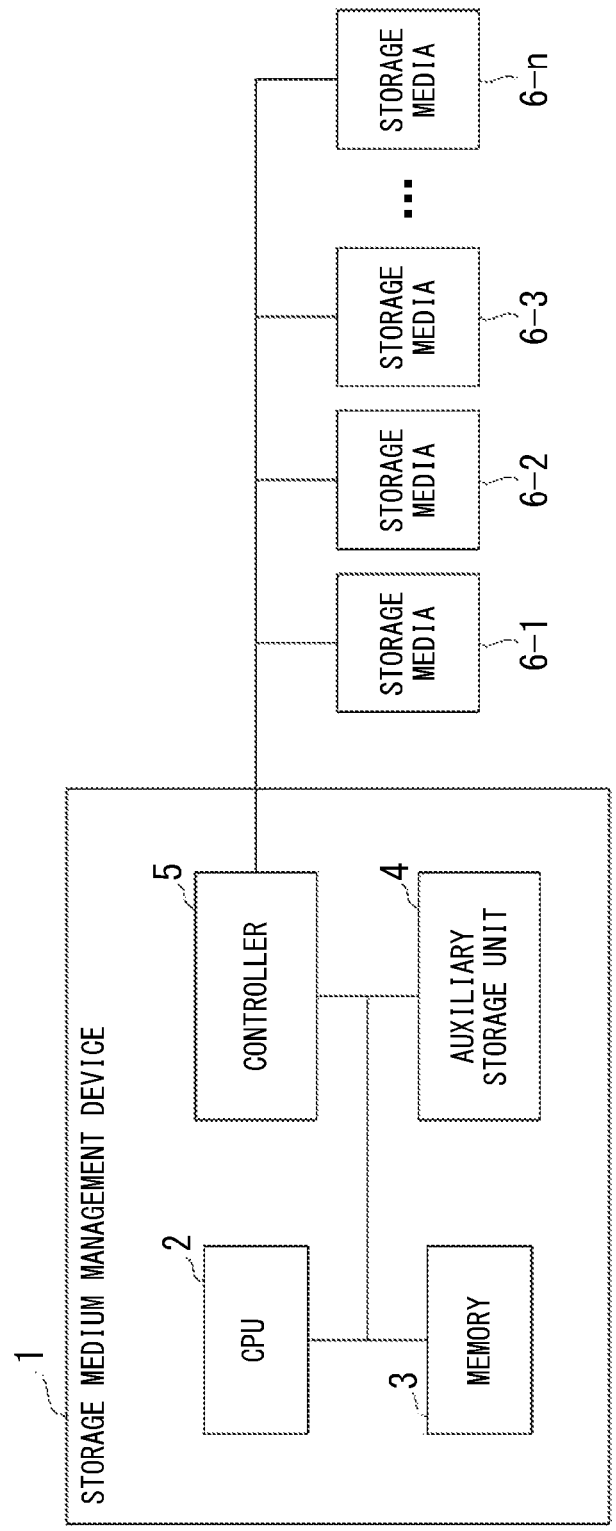
FIG. 1 is a simplified drawing showing the hardware configuration of a storage medium management device of an embodiment.

FIG. 1 is a simplified drawing showing the hardware configuration of a storage medium management device of the embodiment.

The storage medium management device 1, in a storage device configured using a plurality of storage media 6-1 to 6-$n$, manages the storage media 6-1 to 6-$n$, controls data reading and writing with respect to the storage media 6-1 to 6-$n$. The storage media 6-1 to 6-$n$ are configured using NAND memories and read and write data under control of the storage medium management device 1.

The storage media 6-1 to 6-$n$ might have congenitally defective blocks (hereinafter "congenital defective blocks"). Congenital defective block identification indicating the location of congenital defective blocks is registered into a prescribed block of the storage media 6-1 to 6-$n$ at the time of manufacture. To simplify the description to follow, unless specifically noted, the storage media 6-1 to 6-$n$ will be referred to as the storage media 6.

A storage device includes the storage medium 6 that has the possibility of having congenital defective blocks must read and write data with respect to normal blocks, excluding the congenital defective blocks. For this reason, the configuration is such that the storage medium management device 1 performs reading and writing of data with respect to blocks other than blocks indicated by the congenital defective block identification. The congenital defective block identification recorded at the time of manufacture is stored into a block that can be used for reading and writing of user data in the storage media 6. For this reason, in order that the congenital defective block identification not be lost by use by the user, the configuration is such that user, before beginning to use the storage device, reads out the congenital defective block identification from the storage medium 6 and stores it into another non-volatile storage medium. In a conventional configuration, the storage of the congenital defective block identification has been performed entirely with respect to the storage medium 6 at the time of application of power to the storage device.

In such a storage device, if an error occurs in a part or all of the storage medium 6, a maintenance person replaces the storage medium 6 that has failed. When this is done, the storage media 6 after the replacement might have congenital defective blocks in different positions from the storage medium 6 before the replacement. For this reason, it has been necessary for the maintenance person to manually replace, of the congenital defective blocks stored in the separate non-volatile storage medium, the congenital defective block identification acquired from the storage medium 6 before replacement with the congenital defective block identification acquired from the storage medium 6 after the replacement.

This manual congenital defective block identification replacement task can cause work errors. For example, a case be envisioned in which replacement is done of congenital defective block identification that would not actually needed to be replaced. In this case, there is a possibility that congenital defective block identification that would not need to be replaced will no longer exist in the storage medium 6 because of use by the user. That is, such work errors could cause the loss of needed congenital defective block identification.

The storage medium management device 1 of the embodiment has a configuration in which congenital defective block identification is replaced automatically when the storage medium 6 is replaced. The configuration of the storage medium management device 1 of the embodiment will be described in detail below.

The storage medium management device 1 includes a CPU 2 (central processing unit), a memory 3, an auxiliary storage device 4, a controller 5, and the like, which are connected by a bus, and executes a storage medium management program. By executing the storage medium management program, the storage medium management device 1 functions as a device having a defective block identification storage 11, an error information storage 12, a mode manager 13, an input/output device 14, an error information register 15, and a congenital defective block identification register 16. A part of or all of the functions of the storage medium management device 1 may be implemented by hardware such as an ASIC (application-specific integrated circuit), a PLD (programmable logic device), or a FPGA (field-programmable gate array). The storage medium management program may be recorded into a computer-readable storage medium. The computer-readable storage medium is a removable medium such as a flexible disk or an opto-magnetic disk, a ROM, a CD-ROM, or a storage device such as a hard disk built into a computer system. The storage medium management program may be transmitted via an electrical communication circuit.

Figure 2:
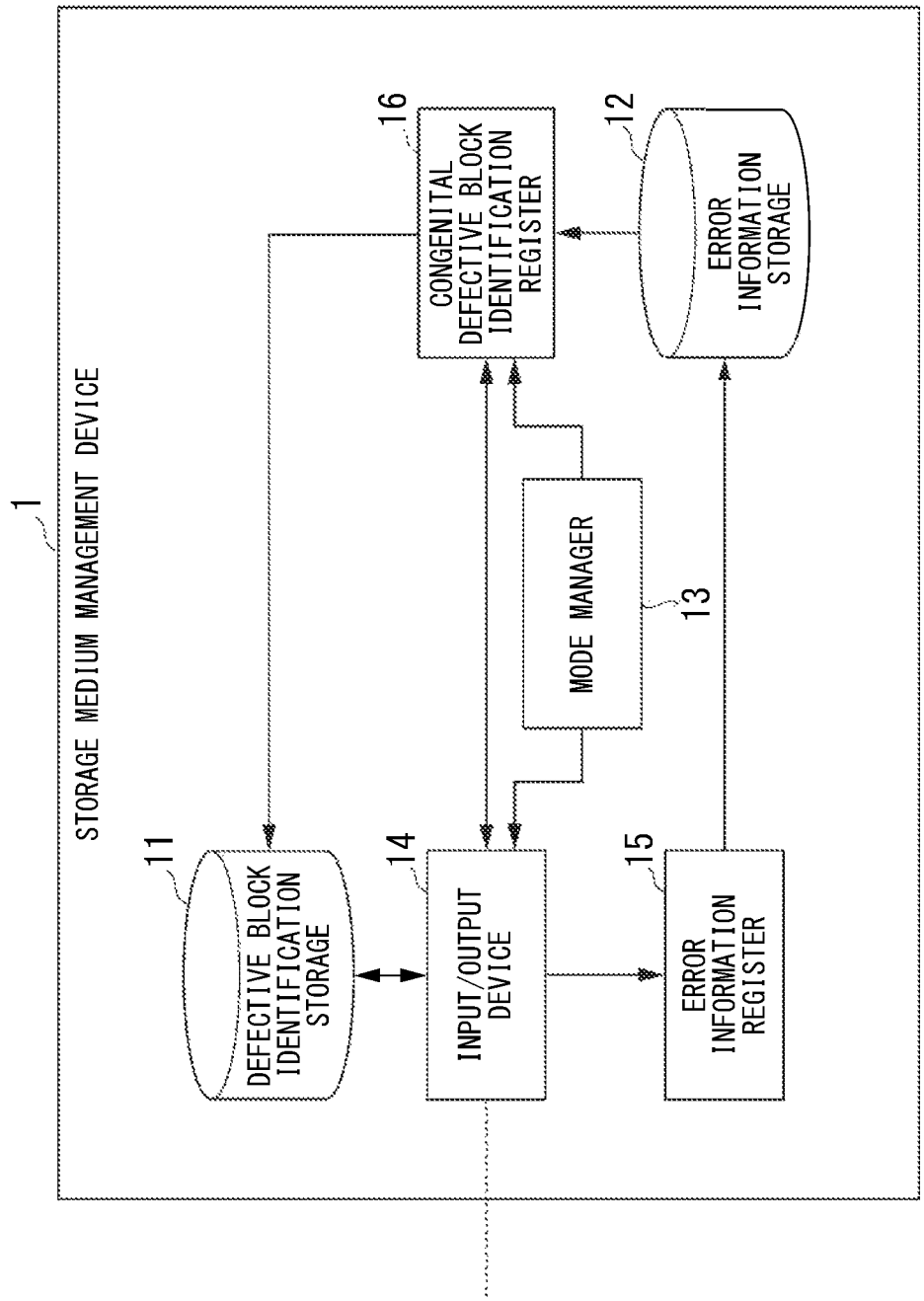
FIG. 2 is a functional block diagram showing the functional configuration of a storage medium management device.

FIG. 2 is a functional block diagram showing the functional configuration of the storage medium management device 1.

The defective block identification storage 11 is realized by a non-volatile storage device such as a magnetic hard disk device or a semiconductor storage device. The defective block identification storage 11 stores defective block identification. The defective block identification indicates the locations of defective blocks in the storage medium 6. The defective block identification is registered into the defective block identification storage 11 by the input/output device 14 and the congenital defective block identification register 16.

The error information storage 12 is realized by a non-volatile storage device such as a magnetic hard disk device or a semiconductor storage device. The error information storage 12 stores error information indicating information regarding reading and writing errors occurring in the storage medium 6. The error information is registered into the error information storage 12 by the error information register 15.

The defective block identification storage 11 and the error information storage 12 are, for example, implemented by the auxiliary storage device 4 shown in FIG. 1.

The mode manager 13 manages the operating mode of its own local device. Operating modes are the user mode and the maintenance mode. The user mode is the mode in which user data is read and written. The maintenance mode is the mode in which pre-processing is performed for causing the local device to operate in the user mode. For example, the mode manager 13 operates when the local device is started. The mode manager 13 then accepts operating mode input at the time of startup and causes the local device to start in the operating mode responsive to the input. If, however, the operating mode is not input at the time of startup, the mode manager 13 starts up the local device in the user mode.

The input/output device 14 reads and writes data with respect to the storage medium 6. The input/output device 14 is implemented, for example, by the controller 5 of FIG. 1. The input/output device 14, based on defective block identification, performs reading and writing of data with respect to normal blocks of the storage medium 6. If a data reading or writing error occurs, the input/output device 14 adds the location of the block at which the error occurred to the defective block identification. In this case, the input/output device 14 outputs information regarding the error that occurred to the error information register 15.

The error information register 15 acquires the information regarding an error output from the input/output device 14 and, based on the acquired information, updates the error information stored in the error information storage 12.

The congenital defective block identification register 16 stores congenital defective block identification into the defective block identification storage 11. The congenital defective block identification register 16 reads out the congenital defective block identification from a prescribed block of the storage medium 6, and adds to the defective block identification the location of the defective block indicated by the read-out congenital defective block identification.

The mode manager 13, the input/output device 14, the error information register 15, and the congenital defective block identification register 16 may be configured as a functional unit of one of the CPU 2 and the controller 5, or as a functional block of both the CPU 2 and the controller 5.

FIG. 3 shows a specific example of defective block identification.

Defective block identification, for example, is stored into the defective block identification storage 11 as a defective block identification table 111 shown as an example in FIG. 3. The defective block identification table 111 has defective block identification records for each block address. A defective block identification record has values for the block addresses and error information. The block address is address information for identifying the storage area location in units of blocks, regarding the storage area managed by the storage medium management device 1. In the example of FIG. 3, a block address is represented by a 4-digit hexadecimal value. In this case, the block address can take a value in the range from 0000 to FFFF.

The error information indicates whether or not the block indicated by the block address is a defective block. For example, in the example of FIG. 3, a block that is a defective block is indicated by error information of 1 and a block that is not a defective block is indicated by error information of 0, the error information being able to take either of these values.

Starting from the initialized state in which the error information values are 0 (that is, in which there are no defective blocks) the defective block identification table 111 is updated by the input/output device 14 or the congenital defective block identification register 16.

FIG. 4 is a drawing showing the associations between block addresses and each storage medium 6.

In the defective block identification described in FIG. 3, the storage area provided by one storage medium 6 is managed as a continuous block addresses. For example, if the storage medium 6 is realized by the n storage media 6-1 to 6-n, the association between the block addresses and the storage medium 6 is managed as shown in the example of FIG. 4.

FIG. 4 shows the example in which the number of blocks of storage area provided by one storage medium 6 is 0FFF. In the example of FIG. 4, block addresses are allocated from 0000 at the top block addresses of the corresponding storage areas managed by the storage medium management device 1, in the sequence of storage media 6-1, 6-2, . . . , 6-n. Block addresses from 0000 to 0FFF are allocated to the storage media 6-1. Block addresses from 1000 to 1FFF are allocated to the storage media 6-2. Block addresses from 2000 to 2FFF are allocated to the storage media 6-3. That is, in the case of the example shown in FIG. 4, block addresses are allocated so that the fourth digit thereof differs for each storage medium 6. In the case of the example of FIG. 4, of the n storage media 6, the allocations to the k-th storage medium 6 are made from (k−1)000 to (k−1)FFF.

The example shown in FIG. 4 is the case in which the number n of storage media 6 is 16 or fewer. If the number of digits in the block address is determined in accordance with the number of storage media 6, the storage medium management device 1 can manage an arbitrary number of storage media 6.

FIG. 5 shows a specific example of error information.

The error information is stored by the error information storage 12, for example, as an error information table 121 such as shown in the example of FIG. 5. The error information table 121 has error information records for each of storage medium identification. For example, an error information record has a value of the storage medium identification, defective block address information, and the error occurrence count.

The storage medium identification is information identifying each storage medium 6. As shown in the example of FIG. 1, if the storage medium 6 is realized by n storage media, the storage medium identification is one value in the range from 1 to n.

The defective block address information indicates the block address of a defective block in the storage medium 6 indicated by the storage medium identification. An error information record in which the defective block address information has not even one block address indicates that there are no defective blocks in the storage medium 6 indicated by the corresponding storage medium identification. A storage medium 6 having a defective block has at least one block address in the defective block address information of the corresponding error information record.

In the example of FIG. 5, of the storage area 0000 to 0FFF provided by the storage media 6-1, there are defective blocks at the block addresses represented by 0000, 0142, and 0F10.

The error occurrence count indicates the number of times an error occurred in reading or writing a block of the storage medium 6 indicated by the storage medium identification. The example of FIG. 5 shows that an error occurred 15 times in reading or writing with respect to the storage media 6-1. That is, the total number of reading and writing errors occurring with respect to the block addresses 0000, 0142, and 0F10 indicated by the defective block address information is 15 times.

The error information records are registered into the error information storage 12 by the error information register 15.

Figure 6:
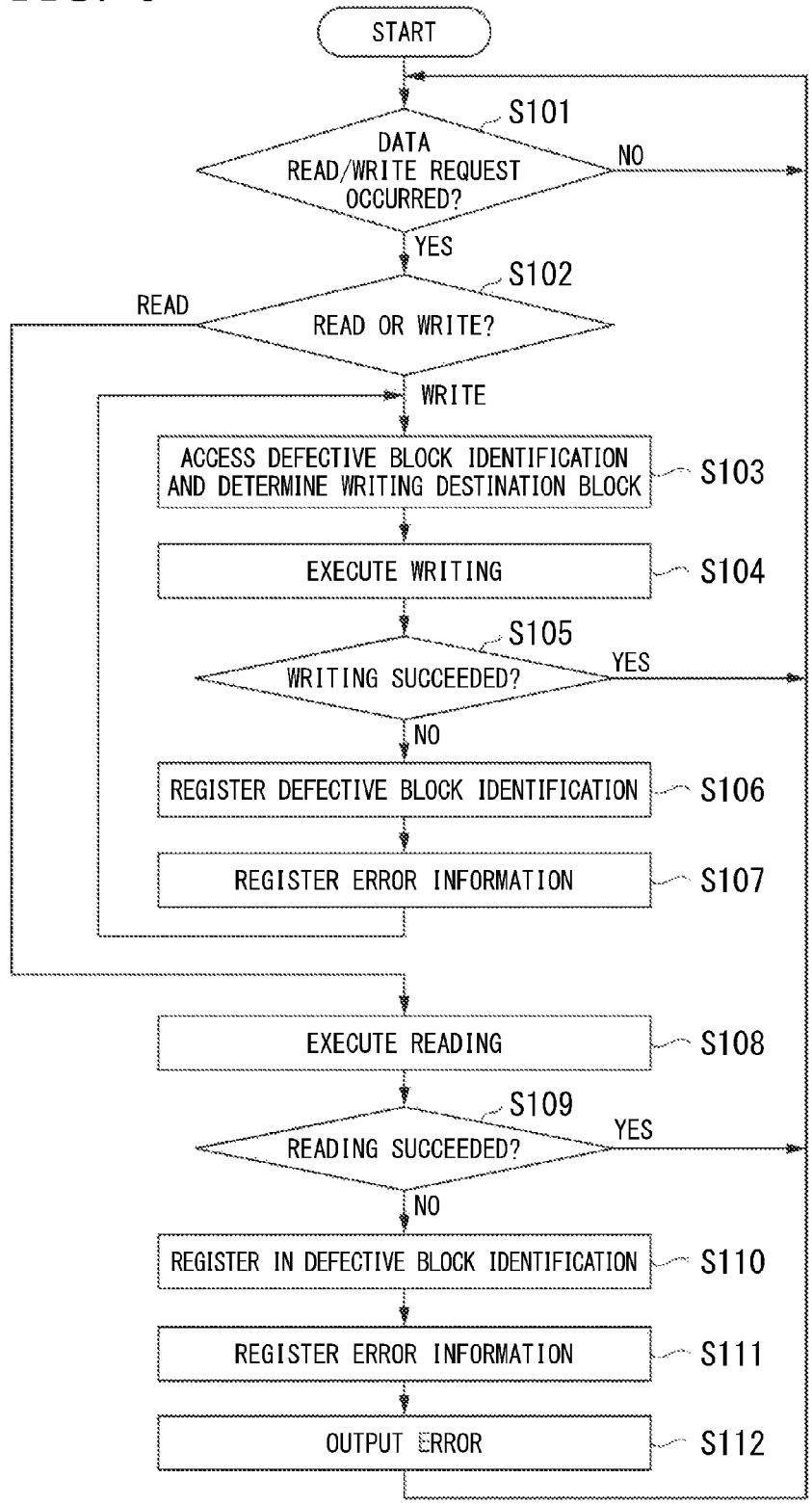
FIG. 6 is a flowchart showing the flow of operations in the user mode of the storage medium management device of the embodiment.

FIG. 6 is a flowchart showing the flow of operation in the user mode of the storage medium management device 1 of the embodiment.

First, the input/output device 14 determines whether or not a data read/write request has occurred with respect to the storage medium 6 (step S101). If a data read/write request has not occurred (NO at step S101), the input/output device 14 return to step S101, and repeats the processing of step S101 until the occurrence of a data read/write request.

If, however, a data read/write request occurred (YES at step S101), the input/output device 14 determines whether the data read/write request was a data read request or a data write request (step S102).

If the data read/write request was a data write request (WRITE at step S102), the input/output device 14 determines the destination block of the data write, based on the defective block identification (step S103). The input/output device 14 accesses the defective block identification table 111 and selects a defective block identification record having 0 as the error information value. The input/output device 14 acquires the values of the block addresses from the selected defective block identification record and, based on the size of the data to be written and the data writing state with respect to each storage medium 6, determines the block address of the data writing destination from the acquired block addresses.

The input/output device 14 executes the writing of data to the block indicated by the block address determined as the data writing destination (step S104). The input/output device 14 judges whether the data writing has succeeded (step S105). If the data writing has succeeded (YES at step S105), return is made to step S101, and step S101 will be repeated until occurrence of the next data read/write request.

If, however, the data writing has failed (NO at step S105), the input/output device 14 registers the defective block identification (step S106). The input/output device 14 accesses the defective block identification table 111 and selects a defective block identification record having a value of block address indicating the block at which the data writing has failed and changes the value of the error information of the selected defective block identification record from 0 to 1.

When the input/output device 14 registers the defective block identification, it outputs the block address of the block at which the data writing failed and the storage medium identification of the storage medium 6 having that block number to the error information register 15. The error information register 15 acquires the block address and the storage medium identification output from the input/output device 14 and, based on the acquired block address and storage medium identification, registers the error information (step S107).

The error information register 15 accesses the error information table 121 and selects an error information record having the value of storage medium identification acquired from the input/output device 14. The error information register 15 acquires the value of the defective block address information from the selected error information record and determines whether or not the value of the block address acquired from the input/output device 14 is included in the acquired defective block address information values. If the block address acquired from the input/output device 14 is not included in the acquired defective block address information values, the error information register 15 adds the block address acquired from the input/output device 14 to the defective block address information and adds 1 to the error occurrence count to update the error information record. If, however, the block address acquired from the input/output device 14 is included in the acquired defective block address information values, the error information register 15 does not update the defective block address information and adds 1 to the error occurrence count to update the error information record.

When it registers the error information, the error information register 15 returns to step S103 and retries writing into the defective block at which the writing has failed.

If, however, the data read/write request was a data read request (READ at step S102) at step S102, the input/output device 14 executes the requested data read (step S108). When this is done, assume that the block address that is the target for reading is included in the data read request. The input/output device 14 executes the reading of data from the block indicated by the block address included in the data read request.

The input/output device 14 judges whether the data reading has succeeded (step S109). If the data reading has succeeded (YES at step S109), return is made to step S101, and the input/output device 14 repeats step S101 until the occurrence of the next data read/write request.

If, however, the data reading has failed (NO at step S109), the input/output device 14 registers the defective block identification (step S110). The input/output device 14 accesses the defective block identification table 111 and selects defective block identification record having a value of block address indicating the block at which the data reading has failed. The input/output device 14 changes the value of the error information of the selected defective block identification record from 0 to 1.

When the input/output device 14 registers the defective block identification, it outputs the block address of the block at which the data reading has failed and the storage medium identification of the storage medium 6 having that block to the error information register 15. The error information register 15 acquires the block address and the storage medium identification output from the input/output device 14 and, based on the acquired block address and storage medium identification, registers the error information (step S111). In this case, the registration of the error information performed by the error information register 15 is the same processing as at step S107.

When the error information is registered by the error information register 15, the input/output device 14 outputs an error indicating that the requested data reading has failed (step S112). The input/output device 14 then returns to step S101 and repeats step S101 until the next occurrence of a data read/write request.

Figure 7:
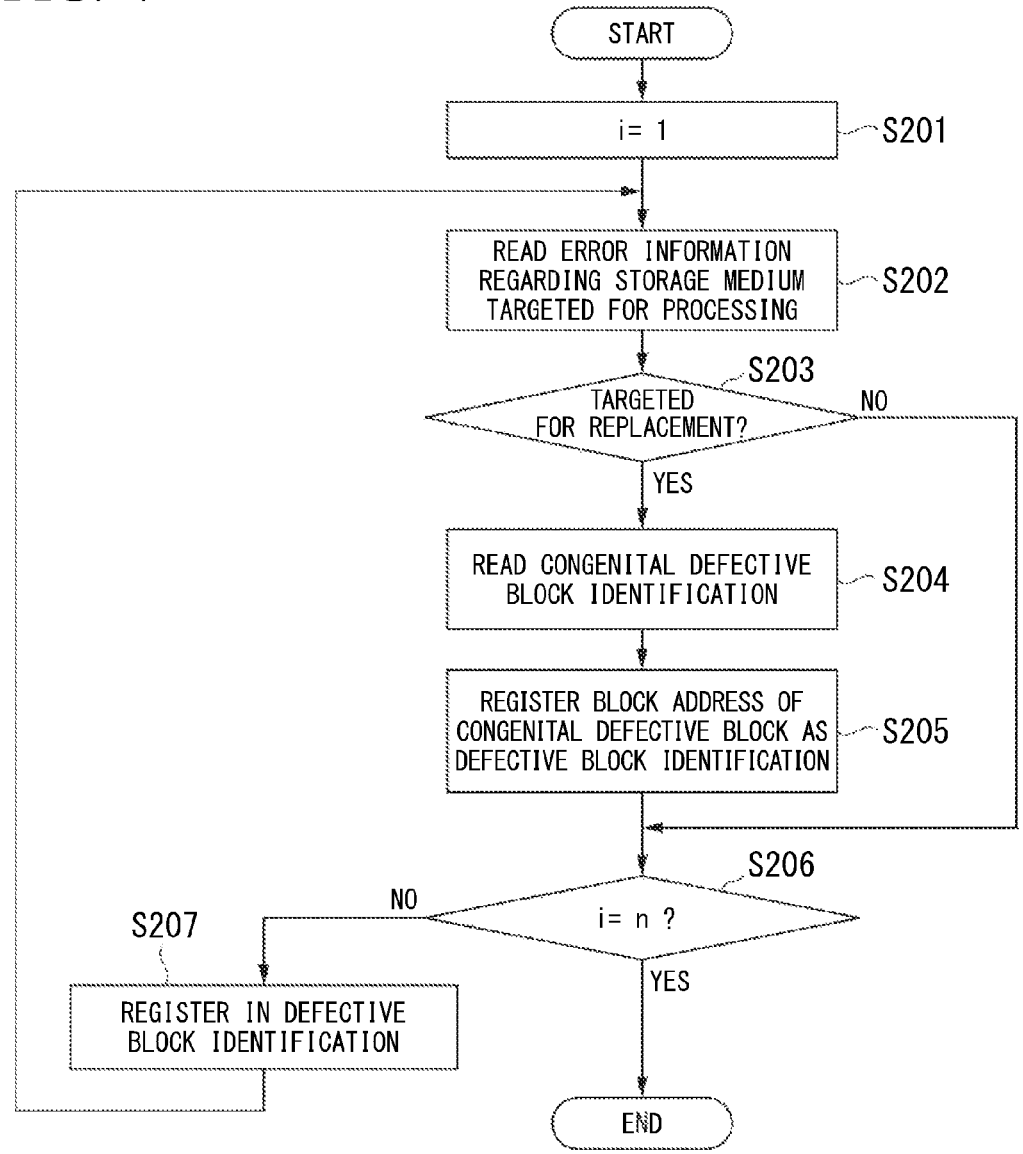
FIG. 7 is a flowchart showing the flow of operations in the maintenance mode of the storage medium management device of the embodiment.

FIG. 7 is a flowchart showing the flow of operation in the maintenance mode of the storage medium management device 1 of the embodiment.

First, the congenital defective block identification register 16 initializes to 1 the variable i, which indicates the storage medium 6 that is the target for processing (step S201). For example, if the storage medium 6 managed by the storage medium management device 1 is realized by n storage media 6 as shown in FIG. 1, this initialization of the variable i sets the storage media 6-1 as the first target for processing.

Next, the congenital defective block identification register 16 reads error information regarding the storage medium 6 that is the target for processing from the error information storage 12 (step S202). The congenital defective block identification register 16 determines whether or not the storage medium 6 that is the target for processing is a target for replacement, based on the error information (step S203).

The congenital defective block identification register 16 accesses the error information table 121 and selects an error information record having the value of the variable i as the storage medium identification. The error information table 121 acquires the value of the error occurrence count from the selected error information record. If the acquired error occurrence count exceeds a prescribed threshold, the congenital defective block identification register 16 determines that the storage media 6-*i* indicated by that storage medium identification is a storage medium 6 targeted for replacement. The storage medium 6 determined to be a target for replacement is assumed to have been replaced by a maintenance person beforehand.

If the storage medium 6 that is the target for processing is a target for replacement (YES at step S203), the congenital defective block identification register 16 reads the congenital defective block identification from the storage medium 6 that is the target for processing (step S204). The congenital defective block identification register 16 registers the block address indicated by the read-out congenital defective block identification into the defective block identification storage 11 as defective block identification (step S205). When this is done, the congenital defective block identification register 16, having excluded defective block identification already registered in the storage medium 6 targeted for processing, registers the block address indicated by the read-out congenital defective block identification. That is, by the processing at step S205 defective block identification registered for the storage medium 6 before replacement is updated by the congenital defective block identification of the storage medium 6 after replacement.

After registration of the defective block identification at step S205 or at step S203, if the storage medium 6 targeted for processing is not targeted for replacement (NO at step S203), the congenital defective block identification register 16 determines whether or not the storage medium 6 targeted for processing is the last one to be targeted for processing. If the storage medium 6 managed by the storage medium management device 1 is realized by n storage media 6 as shown in FIG. 1, the congenital defective block identification register 16 determines whether or not the variable i is equal to n (step S206).

If the variable i is not equal to n (NO at step S206), the congenital defective block identification register 16 determines that the storage medium 6 targeted for processing is not the last one targeted for processing and changes the storage medium 6 targeted for processing to the next processing target. The congenital defective block identification register 16 increments the variable i (step S207). If, however, the variable i is equal to n (YES at step S206), the congenital defective block identification register 16 determines that the storage medium 6 targeted for processing is the last one to be targeted for processing, and processing ends.

The storage medium management device 1 of the embodiment configured in this manner records error information of each storage medium 6 in user mode operation. In the maintenance mode, the storage medium management device 1, based on error information recorded in operation in the user mode, identifies storage media 6 targeted for replacement, reads out congenital defective block identification, and updates the defective block identification for only a storage medium 6 targeted for replacement. For this reason, the storage medium management device 1 of the embodiment can reduce the burden on maintenance personnel when replacing storage media.

A variation example of the storage medium management device 1 of the embodiment will be described below.

The error information registered in the error information table 121 may be configured in a different form from the example shown in FIG. 5. For example, the error information may be configured as information indicating the error occurrence count for each type of reading and writing. In this case, the congenital defective block identification register 16 may determine the storage medium 6 targeted for replacements in accordance with a comparison of error occurrence counts of each type with thresholds for each thereof. Also, for example, the error information may be configured as information indicating the error occurrence counts for each defective block. In this case, the storage medium 6 targeted for replacement may be determined in accordance with the number of blocks, of the blocks registered in the error information, in which the error occurrence count exceeds a prescribed threshold. In this manner, the error information may take any other form as well, in accordance with the criterion for judging a storage medium 6 to be targeted for replacement. Also, the judgment of a storage medium 6 targeted for replacement may be made based on a criterion other than those noted above.

The error information table 121 may be configured to include replacement information directly indicating the replaced storage medium 6. For example, an error information record having 1 as the value of the replacement information can be taken as indicating that the corresponding storage medium 6 had been replaced, and an error information record having 0 as the value of the replacement information can be taken as indicating that the corresponding storage medium 6 had not been replaced. In this case, a maintenance person, after replacing a storage medium 6 targeted for replacement, updates the value of the replacement information of the error information record corresponding to the replaced storage medium to 1 and starts up the storage medium management device 1 in the maintenance mode. The congenital defective block identification register 16 accesses the error information table 121 and selects an error information record having 1 as the replacement information value. The congenital defective block identification register 16 determines that the storage medium 6 indicated by the storage medium identification of the selected error information record is targeted for replacement. The congenital defective block identification register 16 acquires congenital defective block identification from the storage medium 6 determined to be targeted for replacement, and registers the block address indicated by the acquired congenital defective block identification as defective block identification. After registration of the defective block identification, the congenital defective block identification register 16 updates the value of the replacement information to 0 with regard to the error information record corresponding to the storage medium 6 determined to be targeted for replacement. By recording such replacement information into the error information table 121, the storage medium management device 1 can reliably identify a storage medium 6 that has been replaced.

The storage medium management device 1 of the embodiment may be configured as a storage medium management system having the storage medium 6.

According to at least one embodiment described above, by having an error information register that records information regarding errors occurring when reading from and writing to each storage medium as error information and a congenital defective block identification register that identifies a storage medium targeted for replacement, based on the error information, and reads out congenital defective block identification from only a storage medium targeted for replacement, it is possible to lighten the burden on maintenance personnel performing maintenance on storage media.

In the present application, a storage medium managed by the storage medium management device means a non-transitory storage medium.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage medium management device, comprising:
a storage that stores a defective block identification identifying a location of a defective block in a plurality of storage media;
an error information register that stores into the storage an error information indicating that an error has occurred in access to the plurality of storage media; and
a congenital defective block identification register that, if at least one of the plurality of storage media was replaced, identifies a storage medium of the plurality of storage media, which was replaced, based on the error information, reads a congenital defective block identification indicating a location of a congenital defective block from a block of the storage medium replaced, and replaces the defective block identification that had been read out of the storage medium before the storage medium was replaced with the congenital defective block identification that has been read out from the replacing storage medium after the storage medium was replaced.

2. The storage medium management device according to claim 1,
wherein the error information indicates a number of times an error occurred in access to the storage medium for each storage medium, and
wherein the congenital defective block identification register identifies that a storage medium which has the number of times exceeds a prescribed threshold as a storage medium that has been replaced.

3. The storage medium management device according to claim 1,
wherein the storage medium management device operates in either a user mode in which the storage medium management device performs reading and writing of user data or a maintenance mode in which the storage medium management device perform pre-processing for a local device to operate in the user mode, and
further comprising a mode manager that manages a mode of the local device to operate in the user mode or in the maintenance mode,
wherein the congenital defective block identification register operates in the maintenance mode.

4. The storage medium management device according to claim 1, wherein the storage medium is a NAND flash memory.

5. The storage medium management device according to claim 1, further comprising an input/output device that writes data to and reads data from a normal block of the plurality of storage media, based on the defective block identification.

6. A storage medium management method performed by a storage medium management device having a storage that stores defective block identification identifying a location of a defective block in a plurality of storage media, comprising:
   an error information registration step of storing into the storage an error information indicating that an error has occurred in access to a plurality of storage media;
   a congenital defective block identification registration step of, if at least one of the plurality of storage media was replaced, identifying a storage medium of the plurality of storage media, which was replaced, based on the error information, reading a congenital defective block identification indicating a location of a congenital defective block from a prescribed block of the storage medium replaced, and replacing the defective block identification that had been read out of the storage medium before the storage medium was replaced with the congenital defective block identification that has been read out from the replacing storage medium after the storage medium was replaced; and
   an input/output step of writing data to and reading data from a normal block of the plurality of storage media, based on the defective block identification.

7. In a storage medium management method performed by a storage medium management device having a storage that stores a defective block identification identifying a location of a defective block in a plurality of storage media,
   a non-transitory computer-readable storage medium which stores a computer program of:
   an error information registration step of storing into the storage an error information indicating that an error has occurred in access to a plurality of storage media;
   a congenital defective block identification registration step of, if at least one of the plurality of storage media was replaced, identifying a storage medium of the plurality of storage media, which was replaced, based on the error information, reading a congenital defective block identification indicating a location of a congenital defective block from a prescribed block of the storage medium replaced, and replacing the defective block identification that had been read out of the storage medium before the storage medium was replaced with the congenital defective block identification that has been read out from the replacing storage medium after the storage medium was replaced; and an input/output step of writing data to and reading data from a normal block of the plurality of storage media, based on the defective block identification.

8. A storage medium management system, comprising:

a plurality of storage media;

a storage that stores defective block identification identifying a location of a defective block in a plurality of storage media;

an error information register that stores into the storage an error information indicating that an error has occurred in access to plurality of storage media; and a congenital defective block identification register that, if at least one of the plurality of storage media was replaced, identifies a storage medium of the plurality of storage media, which was replaced, based on the error information, reads a congenital defective block identification indicating a location of a congenital defective block from a prescribed block of the storage medium replaced, and replaces the defective block identification that had been read out of the storage medium before the storage medium was replaced with the congenital defective block identification that has been read out from the replacing storage medium after the storage medium was replaced.

\* \* \* \* \*